(12) United States Patent
Koh et al.

(10) Patent No.: US 6,404,402 B1
(45) Date of Patent: Jun. 11, 2002

(54) PREFERENTIAL CRYSTAL ETCHING TECHNIQUE FOR THE FABRICATION OF MILLIMETER AND SUBMILLIMETER WAVELENGTH HORN ANTENNAS

(75) Inventors: Philip J. Koh, Charlottesville; Thomas W. Crowe, Palmyra; Jeffrey L. Hesler, Charlottesville; Perry Wood, Charlottesville; William L. Bishop, Jr., Charlottesville; Robert M. Weikle, Charlottesville, all of VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 0 days.

(21) Appl. No.: 09/381,746

(22) PCT Filed: Mar. 25, 1998

(86) PCT No.: PCT/US98/05831

§ 371 (c)(1),
(2), (4) Date: Apr. 6, 2000

(87) PCT Pub. No.: WO98/47198

PCT Pub. Date: Oct. 22, 1998

Related U.S. Application Data

(60) Provisional application No. 60/041,669, filed on Mar. 25, 1997.

(51) Int. Cl.$^7$ ............................................. H01Q 13/00
(52) U.S. Cl. ........................ 343/786; 343/772; 343/786
(58) Field of Search ................................ 343/786, 772, 343/700 MS, 776, 778, 773, 774, 785

(56) References Cited

U.S. PATENT DOCUMENTS

| 3,339,275 | A | | 9/1967 | Anderson et al. | |
|---|---|---|---|---|---|
| 3,969,749 | A | * | 7/1976 | Bean | 357/49 |
| 3,985,851 | A | | 10/1976 | MacTurk | |
| 4,370,659 | A | * | 1/1983 | Chu et al. | 343/772 |
| 4,757,324 | A | * | 7/1988 | Dhanjal | 343/776 |
| 5,426,442 | A | * | 6/1995 | Haas | 343/778 |
| 6,061,026 | A | * | 5/2000 | Ochi et al. | 343/700 MS |

* cited by examiner

Primary Examiner—Don Wong
Assistant Examiner—James Clinger
(74) Attorney, Agent, or Firm—Miles & Stockbridge P.C.

(57) ABSTRACT

A horn antenna including first and second substrates having at least one first and at least one second horn shaped cavity formed in the first and second substrates, respectively. The horn shaped cavities taper from a narrow end and have a longitudinal axis along a plane parallel to a top surface of the first and second substrates. The second horn shaped cavity is disposed opposite the first horn shaped cavity and is a mirror image of the first horn shaped cavity. Internal surfaces of the first and second horn shaped cavities include a metalization layer. The horn antenna is fabricated by forming at least one mask having a longitudinally extending mask opening on the first and second substrates and preferentially etching the first and second substrate through the mask opening to form the first and second horn shaped cavities. A final shape of the first and second cavities is determined by the shape of the mask opening and the etching time which may be less than the time required to etch the first and second substrates to completion depending on the desired shape of the horn aperture.

28 Claims, 9 Drawing Sheets

PREFERENTIAL CRYSTAL ETCHING TECHNIQUE FOR THE FABRICATION OF MILLIMETER AND SUBMILLIMETER WAVELENGTH HORN ANTENNAS

CROSS REFERENCES TO RELATED APPLICATIONS

This application is a national state of PCT/6898/05831 filed Mar. 25, 1998 which claims benefit of Provisional Appln. No. 60/041,669 filed Mar. 25, 1997.

This application is related to U.S. Provisional Application No. 60/041,668 by Koh et al entitled "INTEGRATION OF HOLLOW WAVEGUIDES, CHANNELS AND HORNS BY LITHOGRAPHIC AND ETCHING TECHNIQUES" filed Mar. 25, 1997, and U.S. Provisional Application Ser. No. 60/042,065 by Bishop et al entitled "REPRODUCTION OF MILLIMETER AND SUBMILLIMETER WAVELENGTH HOLLOW WAVEGUIDES, CHANNELS, HORNS AND ASSEMBLIES BY CASTING/MOLDING TECHNIQUES" filed Mar. 25, 1997, both of which are incorporated herein by reference.

BACKGROUND OF THE INVENTION

1. Field of the Invention

This invention relates to the fabrication of millimeter and submillimeter wavelength devices, and more particularly the fabrication of millimeter and sub-millimeter wavelength horn antennas.

2. Discussion of Background

In general terms, an electromagnetic waveguide is any structure which is capable of confining and guiding electromagnetic energy from one point to another in a circuit. A variety of structures have been devised to accomplish this goal. For example, coplanar waveguide is a type of waveguide which consists of thin strips of coplanar conductive material on a dielectric substrate. Another example is dielectric waveguide in which the radiation is confined in a coaxial dielectric tube by the principle of total internal reflection. A hollow metal electromagnetic waveguide is an electrically conductive hollow tube or pipe-like structure or a collection of such structures designed to confine and guide electromagnetic radiation. A horn is a tapered or flared waveguide structure which couples energy to or from free space and concentrates the energy within a defined spatial distribution (beam pattern). Only the inside surface of these structures must be conductive as the major fraction of the electrical current is constrained by nature to flow within a thickness known as the skin depth which is directly related to wavelength. Also the inner dimensions of such waveguides are determined by the radiation wavelength and are also generally proportional to wavelength.

Because of these relationships, the fabrication and design of hollow waveguides is strongly dependent on the operating wavelength. For example, in the case of microwaves with wavelengths on the order of centimeters, hollow waveguides can be easily fabricated by the extrusion of rectangular metallic tubes which have inside dimensions on the order of centimeters. Injection molded or extruded plastic waveguide components are also typically easily made for microwave wavelengths if they are coated with a sufficiently thick conductive material on internal surfaces. Also waveguide components for microwave frequencies can be made in sections which are joined by flanges and alignment is typically not difficult because of the relatively large dimensions.

However, the fabrication of hollow waveguide assemblies for millimeter and submillimeter wavelengths is typically much more difficult because the dimensions are correspondingly smaller. Also assemblies and subassemblies of waveguides must be combined with active electronic devices such as diodes or transistors and other passive components and circuits to make radio receiver and transmitter components such as heterodyne mixers. Therefore a complex network of accurately aligned, interconnected and very small hollow metal channels must be made and some of these channels must hold active and passive electronic components. This is generally not feasible with microwave style tubing.

A waveguide assembly designed for millimeter and submillimeter wavelengths is traditionally made by fabricating two machined metal "half" blocks, which when joined together, to form a structure comprised of air-filled metal channels. Because of RF electromagnetic field and current considerations, it is rare that any of the slots can typically be formed only in one half with the other half being a simple flat cover. Thus the blocks have slots of various shapes and sizes which are often the mirror image of each other and which require precise control of depth, width and position (i.e., alignment). This "split block" approach solves two basic problems: (1) the difficulty of monolithically forming complex and very small hollow metallic structures and (2) the need to insert a circuit deep within the structure.

In recent years high quality millimeter and submillimeter wavelength components have been manufactured using a technique based on direct machining of metal blocks, for example, as described by Siegel et al., "Measurements on a 215 Ghz Subharmonically Pumped Waveguide Mixer Using Planar Back-to-Back Air-Bridge Schottky Diodes", IEEE Trans. Microwave Theory and Tech., Vol. MTT-41, No. 11, pp. 1913–1921, November 1993, and Blundell et al., "Submillimeter Receivers for Radio Astronomy", Proc. IEEE, Vol. 80, No. 11, pp. 1702–1720, November 1992. FIG. 7 of Blundell et al is a drawing of machined horn antenna and waveguide fabricated using the described technique. A horn antenna is commonly used to couple electromagnetic radiation into the waveguide in communications applications. The primary benefits of machining the waveguide and the horn antenna into the metal block are that it is a well understood process which gives the designer great flexibility, the final structure is robust, and all internal components, such as semiconductor diodes, are protected from the environment. In addition, the machining process is essentially three dimensional, and therefore allows the integration of electromagnetic horns of nearly arbitrary shape.

Although the above-described direct machining technique has gained wide industry acceptance, the expense of the required machining equipment, the personnel expertise, and the fabrication time greatly increase the cost of fabricating millimeter and submillimeter wavelength components. Also, as the desired operating frequency of the components is increased (i.e., wavelength is decreased), the required dimensions of the metal block features shrink proportionally in relation to the decrease in wavelength, making fabrication even more costly and difficult.

Another common technique for fabricating millimeter and submillimeter wavelength components is known as electroforming, for example, as described by Ellison et al., "Corrugated Feedhorns at Terahertz Frequencies-Preliminary Results", Fifth Intl. Space THz Tech. Symp., Ann Arbor, Mich., pp. 851–860, May 1994. In the electroforming technique, a metal mandrel is formed by high precision machining techniques and is then used as a metal core around which a second metal is deposited by electroplating. It is this second metal which eventually forms the hollow metal waveguide after the initial metal is chemically etched away. This technique is employed because it is often easier to machine the mandrel than the actual waveguide itself. Using this technique, components have been fabricated for frequencies up to 2.5 THz, however, the fabrication of the components is still costly and difficult.

Another technique for fabricating millimeter and submillimeter wavelength horn antennas is known as silicon micromachining, for example, as describe by Ali-Ahmad, "92 GHz Dual-Polarized Integrated Horn Antennas", IEEE Trans. Antennas and Prop., Vol. 39, pp. 820–825, July 1991, and Eleftheriades et al., "A 20 dB Quasi-Integrated Horn Antenna", IEEE Microwave and Guided Wave Letters, Vol. 2, pp. 73–75, February 1992, which are incorporated herein by reference. Using this technique, and as in the present invention, the horn antennas are fabricated using a preferential/selective wet etch and silicon wafers with a correct crystal orientation, for example, as shown in FIG. 9(a) such that the etch process proceeds very quickly in the vertical or (100) crystal plane direction but which virtually stops when the (111) crystal planes are exposed, for example, as shown in FIG. 9(b). When the etch is carried to completion, only the (111) plane surfaces are exposed, and the result is a pyramidal shape etched into the silicon having a flare angle θ between the two opposite sides of the pyramidal shape of about 70 degrees, for example, as shown in FIG. 9(b). Although the pyramidal shape etched into the silicon can be used to fabricate a horn antenna, the wide flare angle of 70 degrees causes the horn antenna to have an unacceptably poor directivity (i.e., the beam is very broad). To compensate for this problem, Eleftheriades et al teaches attaching external metal sections having much smaller flare angles to the micromachined horn antenna to increase directivity. However, since these additional sections need to be machined and aligned to the pyramidal shaped horns, much of the benefit of silicon micromachining is lost.

Using quasi-optical techniques, for example, as described by Rebeiz, "Millimeter-Wave and Terahertz Integrated Circuit Antennas", Proc. IEEE, Vol. 80, No. 11, pp. 1748–1770, November 1992, the need for waveguides and horn antennas is completely eliminated. Instead, a traditional antenna is used to couple free-space electromagnetic radiation directly to the microelectronic device in use. This techniques has not yet given as good results as is possible with machined waveguides and horns, and is not yet accepted by the millimeter and submillimeter wavelength community, usually because of a lack of mechanical robustness in devices fabricated using this technique, susceptibility to electromagnetic interference, and the relatively large size of quasi-optical components.

Another technique for fabricating communication components is, for example, monolithic microwave integrated circuit (MMIC) technology, for example, as described by Bahl, "Monolithic Microwave Integrated Circuit Based on GaAs MESFET Technology", in Compound Semiconductor Electronics, The Age of Maturity, Ed. M. Shur, World Scientific, pp. 175–208, 1996. MMIC technology uses fully planar processing to form circuitry on wafers with planar waveguides, such as microstrip or coplanar waveguide, rather than hollow metal waveguides. Although this technology is very useful for fabricating devices operating at microwave frequencies (i.e., typically less than 30 GHz), MMIC technology has not yet been useful for fabricating devices operating at frequencies above about 100 GHz. This technique suffers from high losses due to the properties of the substrate materials and the poor characteristics of planar antennas manufactured using this technique as compared to horn antennas manufactured using other techniques.

Techniques using photoresist formers to fabricate waveguides and horns, for example, as described by Treen et al, "Terahertz Metal Pipe Waveguides", Proc. 18th Intl. Conf. on IR and Millimeter Waves, pp. 470–471, September 1993, Brown et al, "Micromachining of Terahertz Waveguide Components with Integrated Active Devices", Proc. 19th Intl. Conf. on IR and Millimeter Waves, pp. 359–360, October 1994, and Lucyszyn et al, "0.1 THz Rectangular Waveguides on GaAs Semi-Insulating Substrate", Electronic Letters, Vol. 31, No. 9, pp. 721–722, April 1995. Techniques using photoresist formers to fabricate waveguides and horns take advantage of techniques developed by the silicon microelectronics industry. Using this technique, hollow metal waveguides and horns formed around appropriately shaped layers of photoresist have been fabricated. The benefit of this technique is that the processing and shaping of photoresist is a well developed technology which can be precisely controlled on large wafers, thereby allowing many structures to be manufactured simultaneously and thus reducing costs. Also, photolithographic techniques easily allow the precision necessary for waveguide structures at the highest frequencies envisioned. The primary problems with photoresist technology have been forming and processing tall enough photoresist structures cheaply and reliably, removing the thick photoresist from inside the waveguides, because most of the surface area of the resist is not exposed to the solvent but rather covered by the waveguide, and only horns that flare in one dimension are possible, because the horns are flat, resulting in waveguides and horns having poor beam quality.

A new class of photoresist, EPON SU-8, for example, as described by Lee et al., "Micromachining Applications of a High Resolution Ultrathick Photoresist", J. Vac. Sci. Technol. B13(6), pp. 3012–3016, November/December 1995, appears to have solved the first problem of forming and processing tall enough photoresist structures cheaply and reliably, and the present invention offers a solution to the remaining problems.

A suspended filter mixer has been proposed using a process, for example, as described in G.B. Patent No. 9603196-A0 entitled "Waveguide Structures and A Method of Fabrication Thereof", filed on Feb. 15, 1996, incorporated herein by reference. This process allows the full integration of a waveguide with a planar diode structure. However, this fabrication technique requires backside wafer processing, removal of the resist "former" from between the filter structures and the formed waveguide, and also does not address the problem of forming three dimensional horn antennas.

SUMMARY OF THE INVENTION

Accordingly, one object of this invention is to provide a preferential etching technique for the fabrication of millimeter and submillimeter wavelength horn antennas which allows ease of fabrication.

Another object of the present invention to provide a preferential etching technique for the fabrication of millimeter and submillimeter wavelength horn antennas which have arbitrary flare angles.

It is also an object of the present invention to provide a preferential etching technique for the fabrication of millimeter and submillimeter wavelength horn antennas which have flare angles which are much smaller as compared to flare angles of conventional horn antennas fabricated using micromachined silicon.

It is yet another object of the present invention to provide a preferential etching technique for the fabrication of millimeter and submillimeter wavelength horn antennas wherein the horn axis is along a plane of a wafer surface, rather than perpendicular to the plane of the wafer surface.

It is yet further object of the present invention to provide a preferential etching technique for the fabrication of millimeter and submillimeter wavelength horn antennas using etch-exposed mask shapes whose edges are not aligned with wafer flats.

It is yet a still further object of the present invention to provide a preferential etching technique for the fabrication of millimeter and submillimeter wavelength horn antennas wherein early termination of an etch allows for etched features which are not full or truncated pyramids or trenches.

It is yet an additional object of the present invention to provide a preferential etching technique for the fabrication of millimeter and submillimeter wavelength horn antennas wherein a precise horn shape, although governed by crystallographic etch properties, is also adjustable by controlling a shape of an etch mask and a depth of an etch.

It is yet a further additional object of the present invention to provide a preferential etching technique for the fabrication of millimeter and submillimeter wavelength horn antennas having a four or six sided horn aperture.

The above and other objects are achieved according to the present invention by providing a new and improved horn antenna including first and second substrates having at least one first and at least one second horn shaped cavity formed in the first and second substrates, respectively. The horn shaped cavities taper from a narrow end and have a longitudinal axis along a plane parallel to a top surface of the first and second substrates. The second horn shaped cavity is disposed opposite the first horn shaped cavity and is a mirror image of the first horn shaped cavity. Internal surfaces of the first and second horn shaped cavities include a metalization layer. The horn antenna is fabricated by forming at least one mask having a longitudinally extending mask opening on the first and second substrates and preferentially etching the first and second substrate through the mask opening to form the first and second horn shaped cavities. A final shape of the first and second cavities is determined by the shape of the mask opening and the etching time which may be less than the time required to etch the first and second substrates to completion depending on the desired shape of the horn aperture.

BRIEF DESCRIPTION OF THE DRAWINGS

A more complete appreciation of the invention and many of the attendant advantages thereof will be readily obtained as the same becomes better understood by reference to the following detailed descriptions when considered in connection with the accompanying drawings, wherein.

DESCRIPTION OF THE PREFERRED EMBODIMENTS

Figure 1:
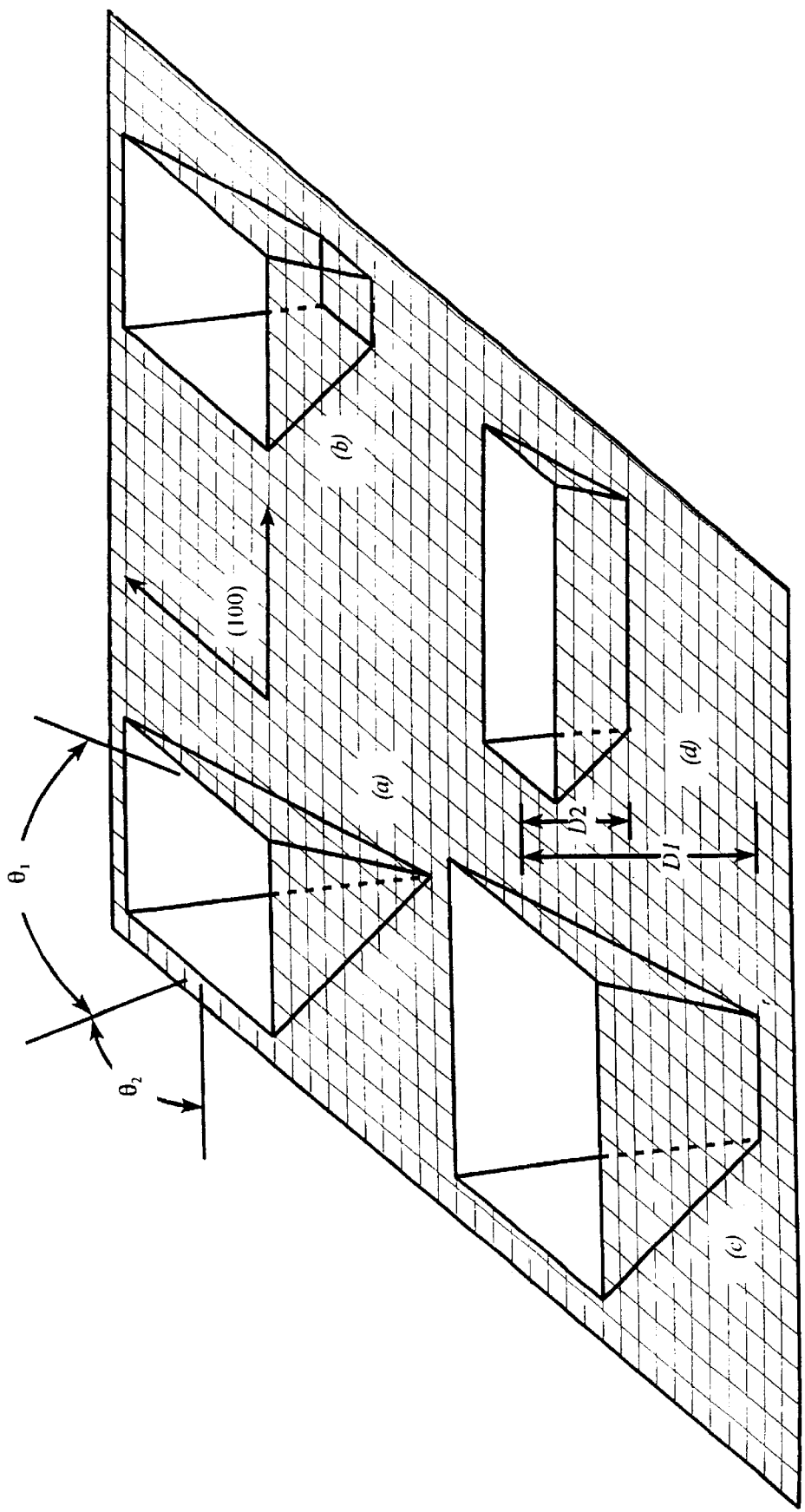
FIG. 1 is a top right perspective view showing pyramidal shapes formed in a silicon wafer when the wafer is etched using a preferential etching technique.

Referring now to the drawings, wherein like reference numerals designate identical or corresponding parts throughout the several views, and more particularly to FIG. 1 thereof, there is illustrated pyramidal shapes formed in a silicon wafer when the wafer is etched using a preferential etching technique.

According to the present invention, horn antenna structures having a narrow flare angle using preferential etching of a crystalline material are produced. The flare angle of a horn antenna is an angle between opposite walls of the horn and determines, for example, the directivity of an antenna beam. A common processing step in silicon micromachining technology, as previously discussed, is to use a preferential etch which attacks one crystallographic surface much more rapidly than others to form etched areas or cavities with very specific and controllable shapes. Typically, a masking layer is formed on the silicon surface which protects some areas, while exposing other areas to the etch. The shape of the exposed areas can have a significant affect on the shape of the etched feature, and must be carefully designed and controlled. For example, this technique uses a silicon wafer whose surface is along the (100) crystal plane and an etchant, such as EDA-P (Ethylene Diarnine-Pyrocatehol, trade name Transene PSE 300, Transene Co., Danvers, Mass. 01923), which vigorously etches the (100) surfaces, but does not etch the (111) surfaces.

FIG. 1(a) shows a square area which is exposed to the preferential etch and is surrounded by a large area which is masked and protected from the etch (e.g., either silicon dioxide or silicon nitride are acceptable mask materials). The etch will proceed down into the silicon perpendicular to the (100) direction, but the lateral etch, which undercuts the mask, will stop when it reaches (111) crystal surfaces. If the sides of the square mask opening are aligned to be in the (111) crystal planes, then there will be negligible undercut and depending on the time the substrate is exposed to the etchant, the resulting etched hole will form a pyramidal shape whose sides are the (111) crystal planes, as shown in FIG. 1(a). Note that the substrate bottom surface (not shown) is parallel to the wafer surface and is therefore a (100) crystal surface. If the etch is continued to completion a pyramidal shaped hole is formed, as shown FIG. 1(a), but if etch is not continued to completion or is obstructed by a resist layer on a bottom surface of the substrate a truncated pyramidal shaped hole is formed, as shown FIG. 1(b). The flare angle $\theta_1$ of the hole, or the angle between two opposite sides of the pyramid, is 70.6 degrees, because this is the angle between two such (111) crystal planes in silicon. Note that the angle $\theta_2$ between the (100) plane and the sides of the truncated pyramidal shape, as shown in FIG. 1(a), is 54.7 degrees, because $\theta_2$ is one half of the remainder of 180 degrees minus the flare angle $\theta_1$ (i.e., 54.7=(180−70.6)/2 degrees). If one side of the unmasked square area is elongated to form a rectangle, the shape of the truncated pyramidal shape etched to completion with an etch depth D1 will be as shown in FIG. 1(c). If the mask width is narrowed, the shape of the truncated pyramidal shape etched to completion with an etch depth D2 will be as shown in FIG. 1(d). Note that the mask width determines the etch depth of the truncated pyramidal shape as shown in FIGS. 1(c) and 1(d).

The most common etch-exposed shapes used in silicon micromachining are squares and rectangles whose sides are aligned with the (111) crystal planes. These form pyramidal or truncated pyramidal cavities (for squares), and V-grooves or truncated V-grooves (for rectangles), as discussed above with reference to FIG. 1. In previous attempts to micromachine horn antennas, such square or rectangular mask shapes were used. The resulting horns were pyramidal with a flare angle of 70.6 degrees and the axis of the horn perpendicular to the wafer surface. This flare angle, however, is too large to form the high-directivity beam patterns required for many applications, and so an external metal piece was required to extend the horn and reshape the beam pattern, for example, as described in the above-noted Eleftheriades et al paper. Although this technique creates acceptable beam patterns, the added cost of machining and aligning the metal horn extensions greatly reduces the benefit of using micromachining as previously discussed.

Figure 2:
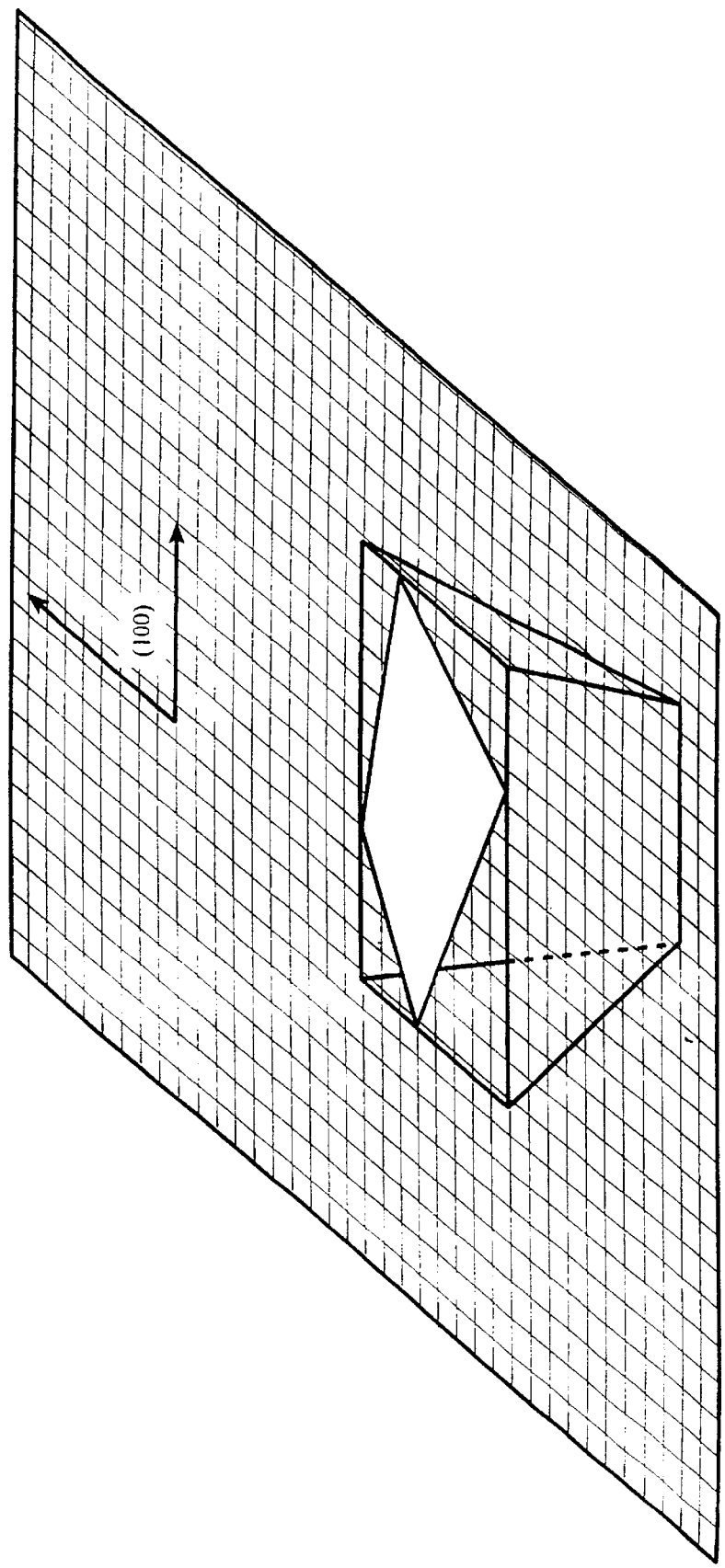
FIG. 2 is a top right perspective view showing pyramidal shape formed in a silicon wafer when the wafer is etched using a preferential etching technique and an odd shaped mask.

FIG. 2 shows, for example, other etch-exposed mask shapes that can also be used in silicon micromachining, including non-convex shapes and shapes whose edges are not aligned to the crystal planes (hereinafter referred to as "odd shapes"). In the case of a mask having an odd shape, the etched cavity will undercut the masking layer and the resulting etched cavities are typically predicted from a common micromachining rule: if the smallest possible circumscribing rectangle whose sides are aligned to the wafer flats (i.e., the crystal planes perpendicular to the (100) planes) which surrounds the odd shape is drawn, then the cavity resulting from the odd shape will be the same as the cavity which would result from the rectangle. Thus according to this rule, again only pyramidal or V-groove structures are possible as shown in FIG. 2.

While this rule would seem to preclude the formation of horns with small flare angles (i.e., <<70 degrees), the rule has one major omission which is exploited according to the present invention. The rule presumes that the etch is allowed to proceed long enough along the (100) crystal plane for the cavity to assume this final pyramidal shape. Specifically, the rule assumes that the etching time is set long enough so that the etch can proceed horizontally under the mask layer from the odd shape completely to the circumscribing rectangle.

Figure 3:
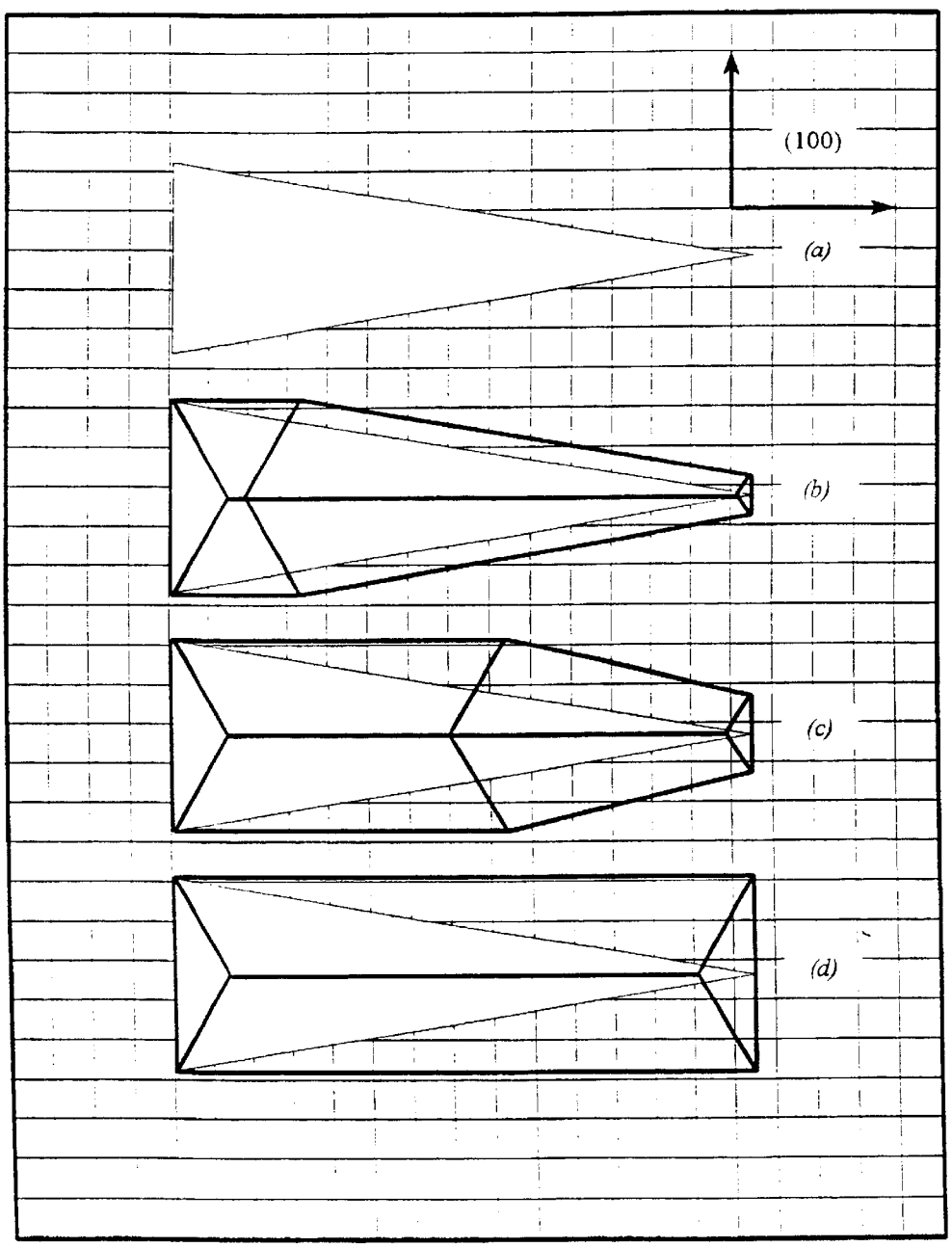
FIG. 3 is a top view showing shapes formed in a silicon wafer when the wafer is etched using a preferential etching technique with a horn-shaped mask for various etching times, according to the present invention.
Figure 4:
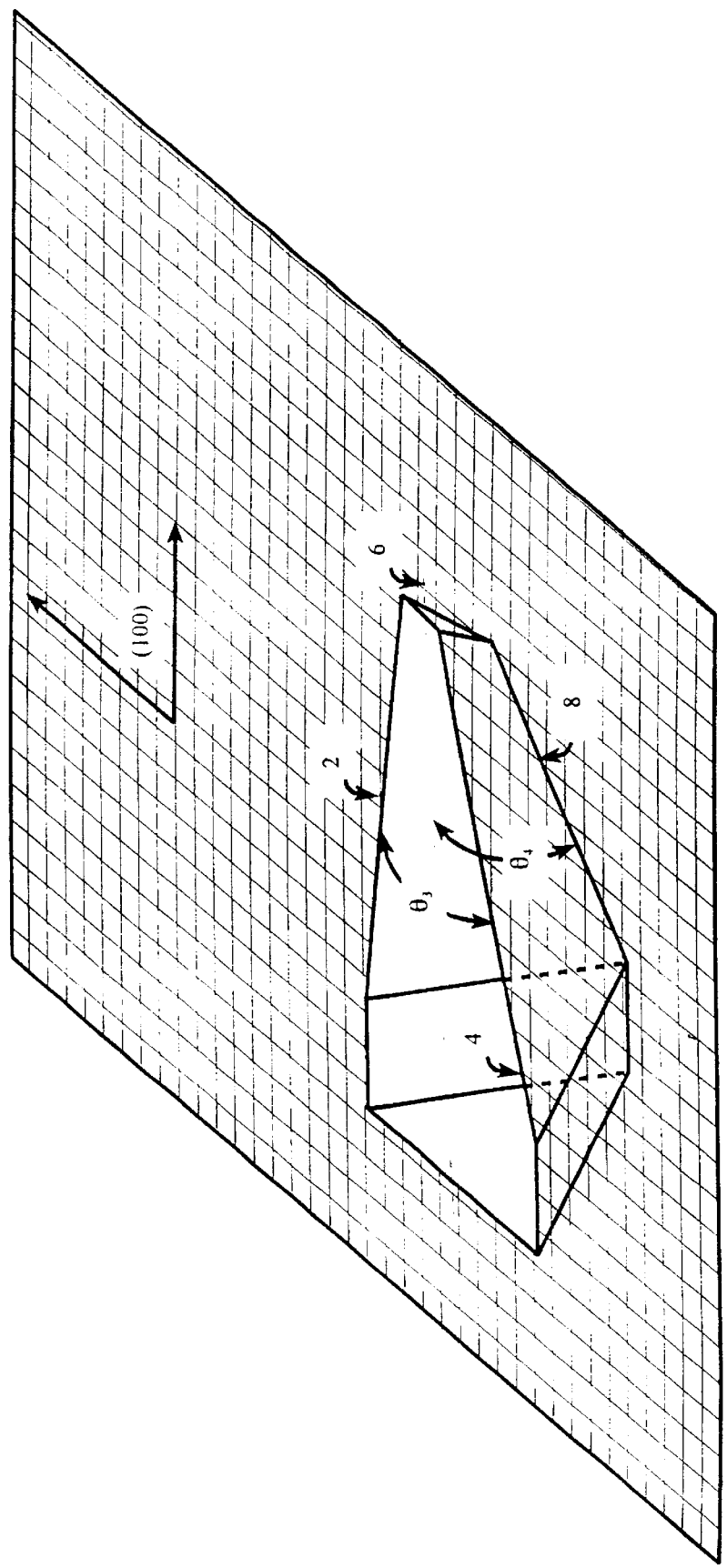
FIG. 4 is a top right perspective view showing a horn with a small flare angle formed in a silicon wafer when the wafer is etched using a preferential etching technique, according to the present invention.

For example, if the triangle-shaped mask shown in FIG. 3(a) is exposed to etch for a sufficient time, the final cavity would be a V-groove structure formed under the circumscribing rectangle of the mask, such as shown in FIG. 1(c), which is not a useful horn structure due to the flare angle of 70.6 degrees, as previously discussed. However, during the etch the cavity proceeds through intermediate shapes outlined in FIGS. 3(b)–3(c) to the final possible shape shown in FIG. 3(d). If the sample is removed from the etch and the etch is terminated at the correct time, a structure in the shape outlined in FIG. 4 can be formed, which is indeed a horn structure with small flare angles $\theta_3$ and $\theta_4$ in both the horizontal and vertical directions to the (100) plane. The horizontal flare angle $\theta_3$ is defined as an angle formed between edges 2 and 4 of the horn structure, and the vertical flare angle $\theta_4$ is defined as an angle formed between the longitudinal axis 6 of the horn cavity and a cavity edge 8. However, note that the horn is now oriented in the plane of the wafer, rather than perpendicular to the wafer surface as compared to conventional micromachined silicon horns. Also, the flare angle $\theta_3$ of the horn is equal to the angle of the initial opening in the mask material and the flare angle $\theta_4$ is determined by the taper of the mask material since the etch depth is proportional to the mask width as previously discussed with reference to FIGS. 1(c) and 1(d). Accordingly, the flare angles $\theta_3$ and $\theta_4$ can be easily controlled to achieve any arbitrary angle selected to produce the desired beam pattern by using an appropriately shaped mask and by terminating the etch at the proper time.

Figure 5:
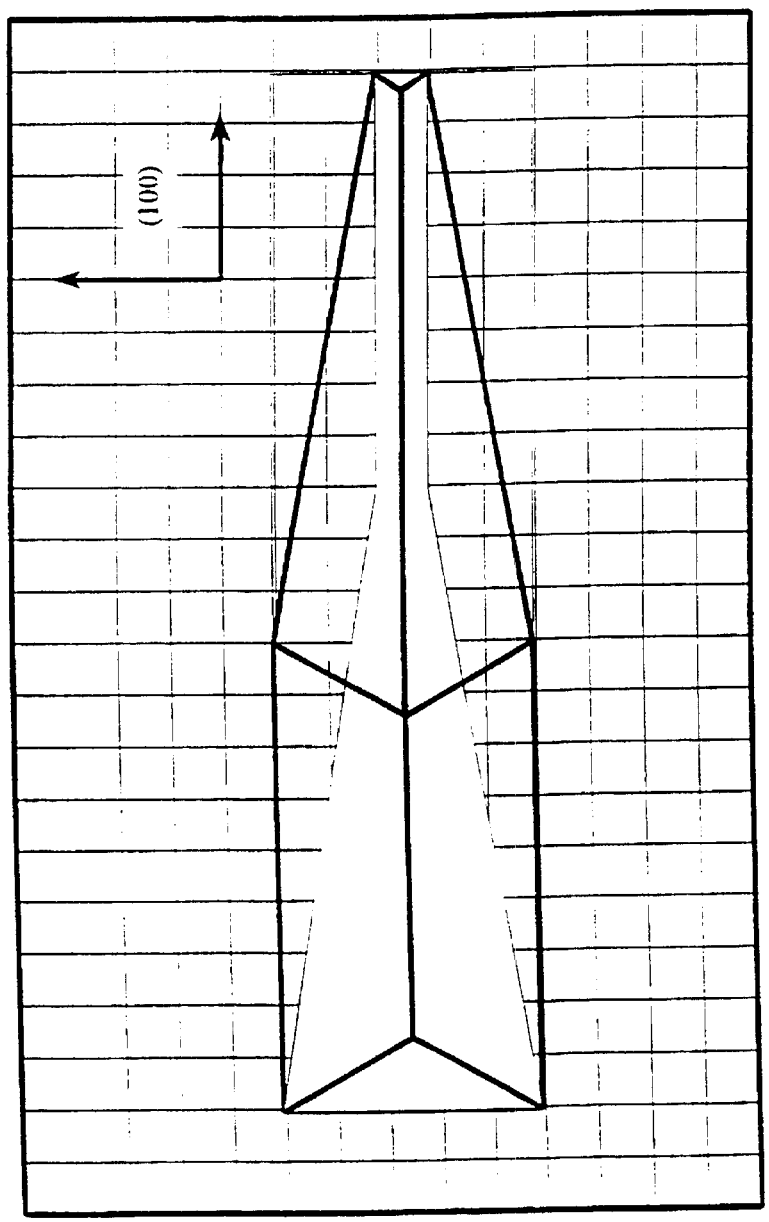
FIG. 5 is a top view showing a mask shape having a narrow rectangle added to a tip of a horn shaped mask for etching a silicon wafer using a preferential etching technique, according to the present invention.

One problem with using the mask shape shown in FIG. 3(a), is that this shape does not produce a horn structure that tapers to a sharp point, as may be desirable. This may be corrected by a modification to the mask shape, so that a very narrow rectangle is added to the tip of the triangular opening in the mask, as shown in FIG. 5. In FIG. 5, the intermediate shape is a horn which tapers down to a size which is the width of the added rectangle. Since the added rectangle is formed by photolithography, it can easily be made to be as narrow as a few microns or less. Since horns fabricated according to the present invention need to be precise in shape only to dimensions on the order of a wavelength of the electromagnetic radiation to be coupled, and these wavelengths are in the range of, for example, 50 to 6,000 microns for millimeter and submillimeter applications, the effect of a non-ideal horn shape (i.e., a non-perfect triangle due to the added rectangle-shaped mask) is negligible.

Figure 6:
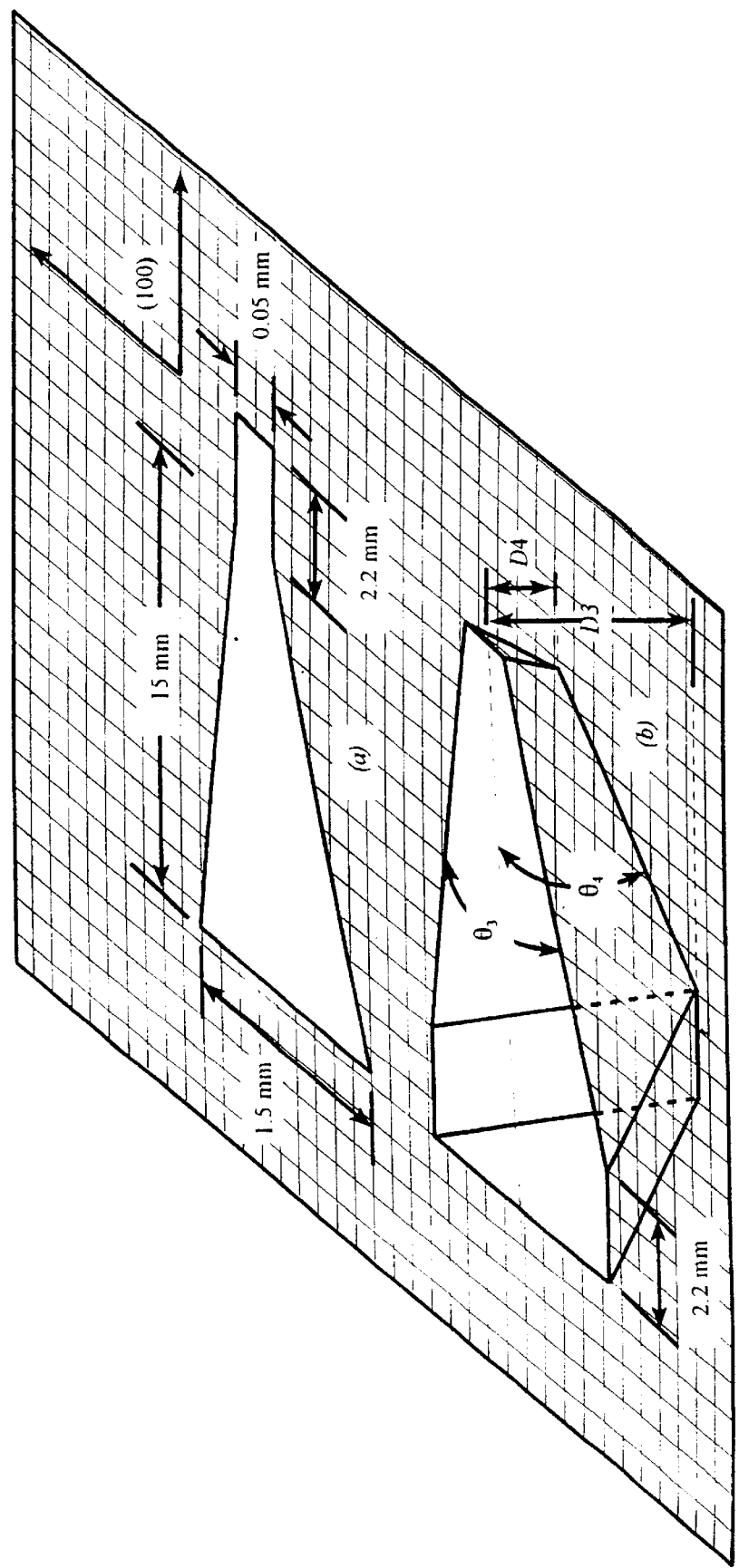
FIG. 6 is a top right perspective view showing the details for etching a silicon wafer using a preferential etching technique to fabricate a millimeter or submillimeter wavelength horn antenna having a small flare angle, according to the present invention.

FIG. 6(b) is an example of a horn structure fabricated according to the present invention, wherein a (100) oriented crystalline silicon wafer is used and the etch mask layer is formed, for example, by thermal-growth or deposition (e.g., sputtering or evaporation) of silicon dioxide or silicon nitride as shown in FIG. 6(a). Openings in the masking layer are formed, for example, in a shape like that shown in FIG. 5 by standard lithographic processes. In the case of, for example, a 585 GHz horn with a flare angle of 5.7 degrees, a mask with dimensions as shown in FIG. 6(a) was used. The preferential etch was EDA-P and the silicon was etched for a period of 330 minutes at 115 degrees Celsius. The resulting etch depth D3 was 580 microns, the etch depth D4 was 0.07 mm (i.e., D4=0.05 mm×tan 54 degrees), and the etch propagated under the silicon dioxide, along the axis of the horn, about 2.2 mm, as shown in FIG. 6(b). The resulting cavities taper from a narrow end with small flare angles $\theta_3$ and $\theta_4$ in both the horizontal and perpendicular directions to the (100) plane as shown in FIG. 6(b) and as discussed with reference to FIG. 4. The flare angle, length of the horn, and depth of the etch may be varied to obtain the desired beam pattern. Next, Au layers are deposited onto the interior silicon surfaces of the horn by sputter deposition, evaporation, plating, etc., to achieve a high surface conductivity that is typically required for low loss propagation of electromagnetic radiation in horns and waveguides fabricated according to the present invention.

Figure 7:
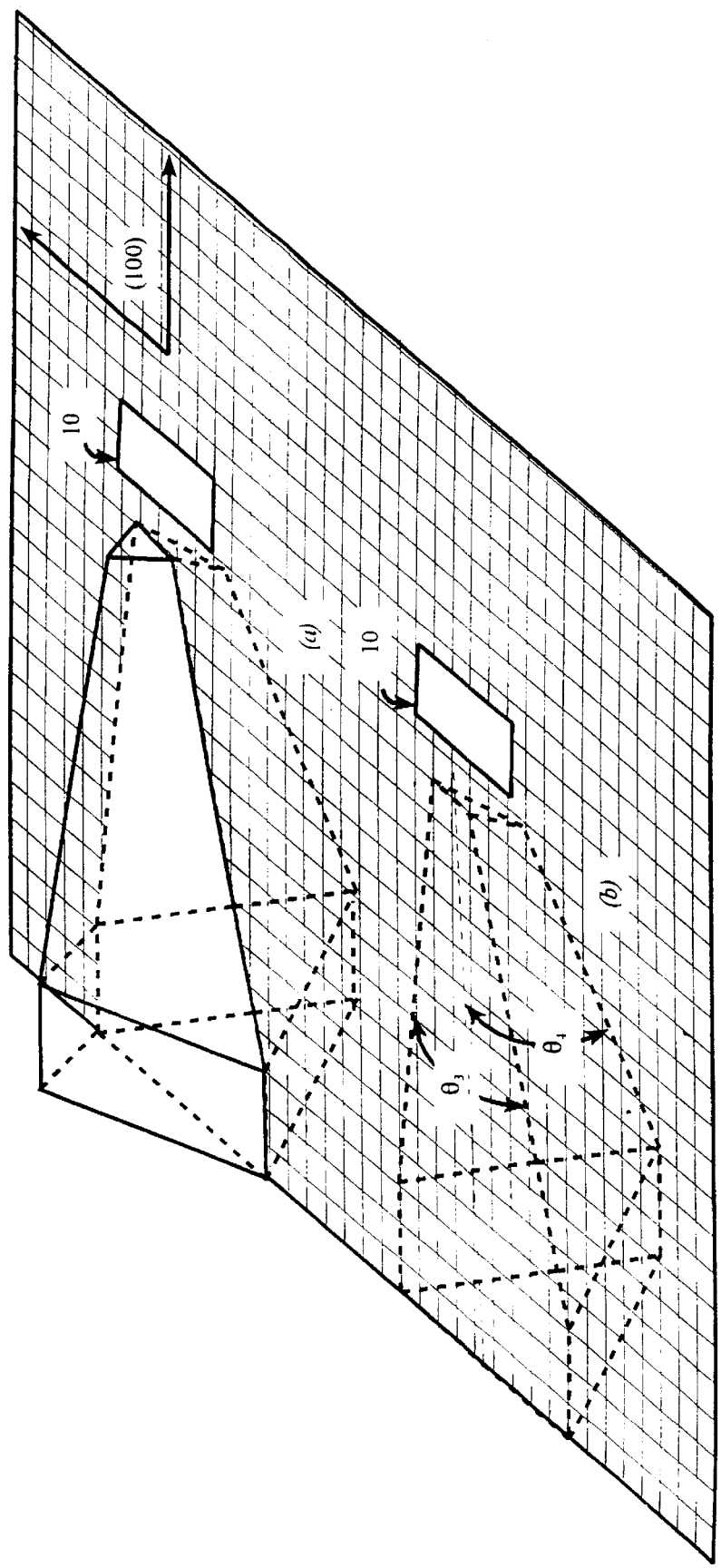
FIG. 7 is a top right perspective view showing millimeter or submillimeter wavelength horn antennas having a small flare angle, fabricated according to the present invention.

It should be noted that the horn structure shown in FIG. 6(b) is not a fully enclosed horn, but is rather a half horn. To form a complete horn, two wafers can be diced to open the horn aperture, prepared and placed face-to-face as shown in FIG. 7(a). This is particularly useful, since any electronic components 10 which need to be integrated with the horn antenna can be integrated on the wafer, for example, as described in the above noted G.B. Patent No. 9603196-A0, incorporated herein by reference, before the two wafers are joined. The components 10, such as detector diodes, waveguides, channels, and other devices, such as electronic devices, circuits, antennas, filters, etc., may be integrated with the horn antenna on the wafer. Note that the resulting horn antenna of FIG. 7(a) is symmetrical with a horn axis parallel to the top surface of the wafer and having flare angles as defined with reference to FIG. 1(a).

A simpler technique to close off the horn structure of FIG. 6(b) would be dice the wafer to open the horn aperture and to place a metal plane along the silicon wafer (100) surface as shown in FIG. 7(b). Although the resulting horn would have reduced symmetry due to its non-symmetrical shape as compared to the horn of FIG. 7(a), the horn could be suitable for some applications where the symmetry of the beam is not critical.

In addition to the horn structures of FIG. 6(b), an appropriately shaped mask could be formed and the etching time controlled so as generate the horn cavities shown in FIGS. 8(a) and 8(b). The horn cavity of FIG. 8(a) results if the etch is taken to completion, whereas the horn cavity of FIG. 8(b) results if the etch is not taken to completion. In FIG. 8a, the cavity has a horn flare angle $\theta_1$, between edges 2 and 4, a horn flare angle $\theta_4$ between line 6 which is parallel the substrate (100) surface and edge 8, a face angle $\theta_2$ determined by the crystal properties (i.e., 54.7 degrees for silicon), a horn length D5, an etch depth D3, a maximum etch depth D3max, and horn width D6. According to the present invention $\theta_1$ and D5 are variable depending on design criteria, D3 is fixed since the substrate is etched to completion, with $D6=2\times D5\times\tan((\theta_1/2))$; $D3max=(D6/2)\times\tan(\theta_2)$; and $\tan(\theta_4)=\tan(\theta_1/2)\times\tan(\theta_2)$. Accordingly, the cavity in the substrate is of a specific and controllable shape, allowing design flexibility in the design of the horn antenna aperture according to the present invention.

In FIG. 8b, the cavity has a horn flare angle $\theta_1$ between edges 2 and 4, a horn flare angle $\theta_4$ between line 6 which is parallel to the substrate 2 surface and edge 8, a face angle $\theta_2$ determined by the, crystal properties (i.e., 54.7 degrees for silicon), a horn length D5, an etch depth D3, a maximum etch depth D3max, and horn widths D6 and D7. Note edges 3 and 2, and 5 and 4 are parallel to each other, respectively. According to the present invention $\theta_1$, D5 and D3 are variable depending on design criteria, with $D6=2\times D5\times\tan(\theta_1/2)$; $D3max=(D6/2)\times\tan(\theta_2)$; $\tan(\theta_4)=\tan(\theta_1/2)\times\tan(\theta_2)$; and $D7=D6-(2\times D3)/(\tan(\theta_2))$. Accordingly, the cavity in the substrate is of a specific and controllable shape, allowing design flexibility in the design of the horn antenna aperture according to the present invention.

Figure 8:
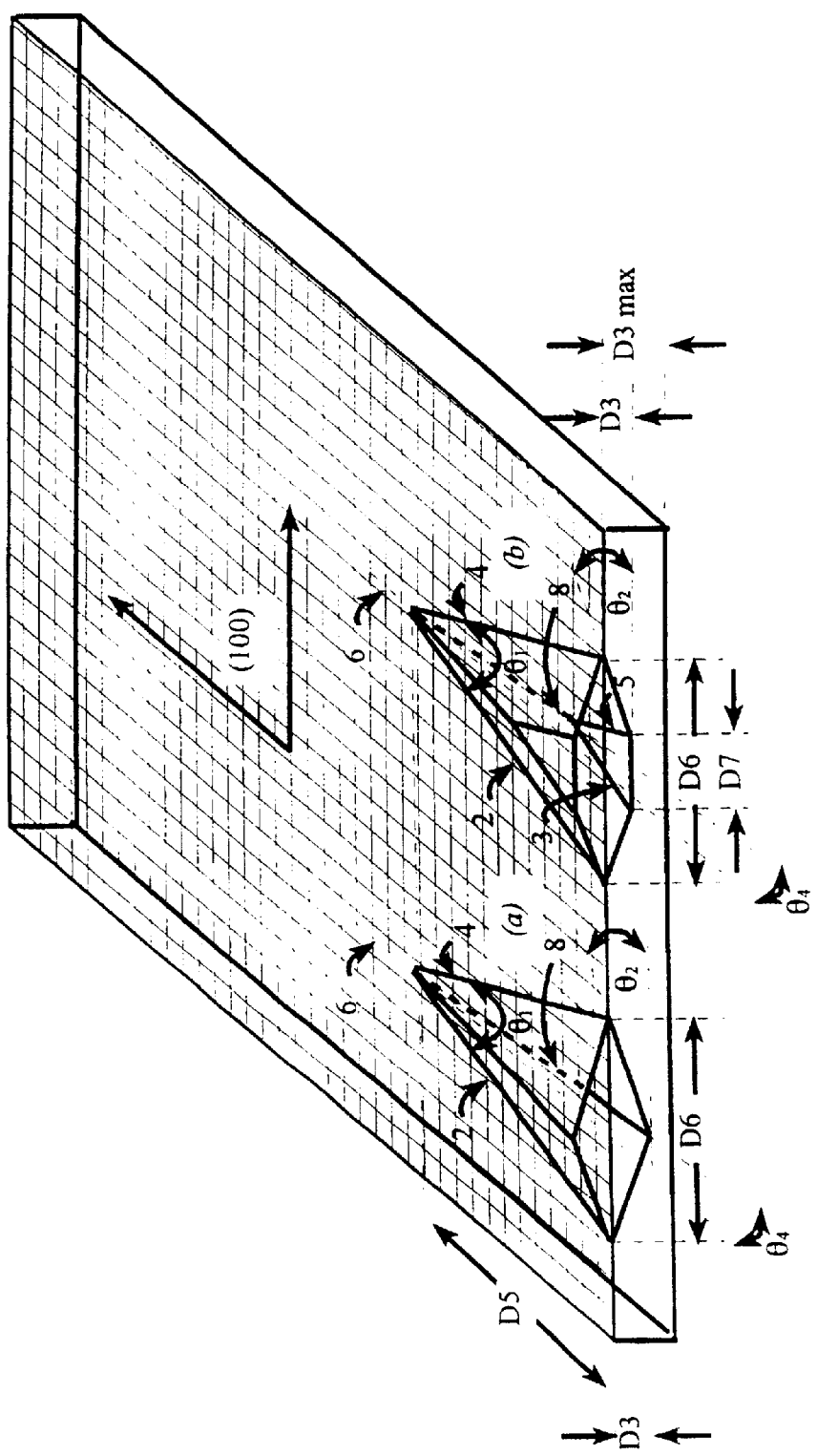
FIG. 8 is a top right perspective view showing millimeter or submillimeter wavelength horn antennas having four sided and six sided horn apertures, fabricated according to the present invention.
Figure 9B:
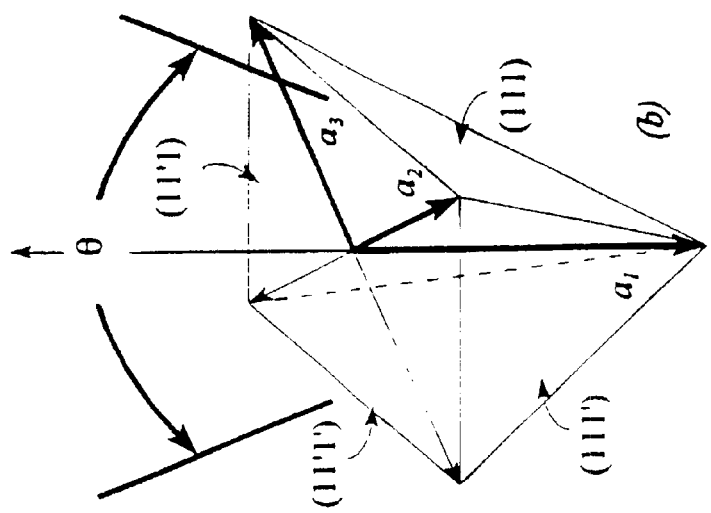
FIG. 9 is a top right perspective view showing an orientation of a silicon wafer for describing the operation of a preferential etching technique of the silicon wafer.
Figure 9A:
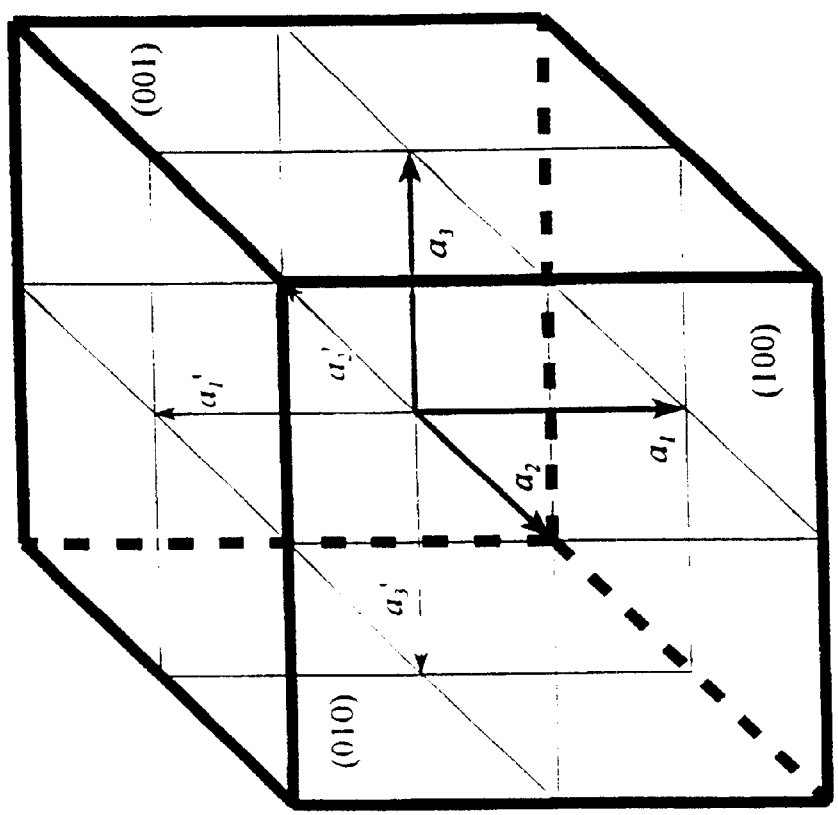

Note that according to this technique horn structures having four sided and six sided apertures can be fabricated, as shown in FIGS. 8(a) and 8(b), respectively. In addition, as shown in FIG. 8, multiple cavities having similar or different geometries and integrated with other components could be mass produced on the same silicon substrate, thereby reducing fabrication costs.

Although the present invention is described in terms of a horn antenna, it will be appreciated that alternative structures can also be fabricated by the present method such as oscillators, multipliers, amplifiers and detectors with active components formed integrally with the waveguide or other channel structures and, where necessary, with active components suspended within the channel structures formed on the wafer.

Obviously, numerous modifications and variations of the present invention are possible in light of the above teachings. It is therefore to be understood that within the scope of the appended claims, the invention may be practiced otherwise than as specifically described herein.

What is claimed is:

1. A horn antenna, comprising:
   a first substrate having a surface; and
   at least one first horn shaped cavity formed in the first substrate, said cavity extending into the first substrate from the surface of the first substrate, tapering from a narrow end and having a longitudinal axis along a plane parallel to the surface of the first substrate.

2. The horn antenna according to claim 1, wherein the first horn shaped cavity has predetermined horizontal and vertical flare angles, the horizontal flare angle is defined as an angle formed between edges of the first horn shaped cavity in the surface of the first substrate, and the vertical flare angle is defined as an angle formed between the longitudinal axis of the first horn shaped cavity and a cavity edge opposite the surface of the first substrate.

3. The horn antenna according to claim 2, wherein the predetermined flare angles of the first horn shaped cavity are in a range from 0 to 90 degrees.

4. The horn antenna according to claim 1, wherein internal surfaces of the first horn shaped cavity include a metalization layer.

5. The horn antenna according to claim 4, wherein the metalization layer is an Au layer.

6. The horn antenna according to claim 4, further comprising:
   a metalized planar surface disposed adjacent to the first horn shaped cavity so as to form therewith a horn antenna having a three or four sided aperture.

7. The horn antenna according to claim 1, wherein the first horn shaped cavity is formed in the first substrate by preferential etching the first substrate through at least one mask produced by a photolithography process for a time period less than a time required to etch the first substrate to completion.

8. The horn antenna according to claim 7, wherein the first substrate is crystalline and the mask has edges which are not aligned with predetermined crystal planes of the first substrate.

9. The horn antenna according to claim 1, wherein the first horn shaped cavity comprises a conical prism having a longitudinal axis parallel to the surface of the first substrate.

10. The horn antenna according to claim 1, further comprising:
    a second substrate having a surface; and
    at least one second horn shaped cavity formed in the second substrate;
    wherein the second horn shaped cavity is disposed opposite the first horn shaped cavity and is a mirror image of the first horn shaped cavity.

11. The horn antenna according to claim 10, wherein internal surfaces of the first and second horn shaped cavities include a metalization layer so as to form a full horn antenna having a four or six sided aperture.

12. The horn antenna according to claim 10, further comprising:

at least one electronic component provided on at least one of the first and second substrates.

13. The horn antenna according to claim 1, further comprising:

at least one electronic component provided on the first substrate.

14. A method of fabricating a horn antenna, comprising the steps of:

forming at least one mask having a longitudinally extending mask opening on a surface of a first substrate; and preferentially etching the first substrate through the mask opening to form at least one first horn shaped cavity in the first substrate, the first horn shaped cavity extending into the first substrate from the surface of the first substrate and having a longitudinal axis along a plane parallel to the surface of the first substrate.

15. The method according to claim 14, wherein the step of preferentially etching comprises the step of:

controlling an etching time to be a time period less than a time required to etch the first substrate to completion.

16. The method according to claim 15, wherein the step of controlling an etching time comprises:

controlling an etching time of the preferential etching so as to form the first horn shaped cavity having the predetermined horizontal and vertical flare angles in a range from 0 to 90 degrees, the horizontal flare angle is defined as an angle formed between edges of the first horn shaped cavity in the surface of the first substrate, and the vertical flare angle is defined as an angle formed between the longitudinal axis of the first horn shaped cavity and a cavity edge opposite the surface of the first substrate.

17. The method according to claim 15, wherein the step of controlling an etching time comprises:

controlling the etching time of the preferential etching so as to form the first horn shaped cavity comprising a conical prism having a longitudinal axis parallel to the surface of the first substrate.

18. The method according to claim 14, further comprising the step of:

depositing a metalization layer on internal surfaces of the first horn shaped cavity.

19. The method according to claim 18, wherein the step of depositing a metalization layer comprises:

depositing an Au layer using sputter deposition.

20. The method according to claim 18, further comprising the step of:

disposing a metalized planar surface adjacent to the first horn shaped cavity so as to form a horn antenna having a three or four sided aperture.

21. The method according to claim 14, wherein the step of preferentially etching comprises:

preferentially etching using an etchant comprising ethylene diamine.

22. The method according to claim 14, wherein the first substrate is crystalline and the step of forming at least one mask comprises:

forming at least one mask opening with edges which are not aligned with predetermined crystal planes of the first substrate.

23. The method according to claim 14, further comprising the steps of:

forming at least one mask having a longitudinally extending mask opening on a second substrate; and preferentially etching the second substrate through the mask opening to form at least one second horn shaped cavity in the second substrate, the second horn shaped cavity having a longitudinal axis along a plane parallel to a surface of the second substrate and is a mirror image of the first horn shaped cavity.

24. The method according to claim 23, further comprising the step of:

disposing the second horn shaped cavity opposite the first horn shaped cavity.

25. The method according to claim 24, further comprising the step of:

depositing a metalization layer on internal surfaces of the first and second horn shaped cavities so as to form a horn antenna having a four or six sided aperture.

26. The method according to claim 23, further comprising the step of:

providing at least one electronic component on at least one of the first and second substrates.

27. The method according to claim 14, further comprising the step of:

providing at least one electronic component on the first substrate.

28. A horn antenna fabricated by a process comprising:

forming at least one mask having a longitudinally extending mask opening on a surface of a first substrate; and preferentially etching the first substrate through the mask opening to form at least one first horn shaped cavity in the first substrate, the first horn shaped cavity extending into the first substrate from the surface of the first substrate and having a longitudinal axis along a plane parallel to the surface of the first substrate.

* * * * *